US008432696B2

(12) United States Patent
Ribas et al.

(10) Patent No.: US 8,432,696 B2
(45) Date of Patent: Apr. 30, 2013

(54) USING A BATTERY PACK TO FACILITATE THERMAL TRANSFER IN A PORTABLE ELECTRONIC DEVICE

(75) Inventors: Carlos A. Ribas, Los Altos, CA (US); Fletcher R. Rothkopf, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 217 days.

(21) Appl. No.: 12/958,157

(22) Filed: Dec. 1, 2010

(65) Prior Publication Data

US 2012/0140419 A1   Jun. 7, 2012

(51) Int. Cl.
*H05K 7/20* (2006.01)
*H01M 2/10* (2006.01)

(52) U.S. Cl.
USPC ............... 361/714; 361/679.46; 361/679.54; 361/679.55; 361/704; 361/707; 165/80.3; 165/104.33; 165/185; 429/7; 429/99; 429/100; 429/120; 429/152

(58) Field of Classification Search .......... 361/679.46–679.56, 700–714, 720–724, 816, 361/818, 831; 174/15.1, 16.3, 252; 165/80.3, 165/104.33, 185; 429/100, 150, 138, 143, 429/148, 151, 153, 162, 175, 161, 176, 99, 429/142, 185; 320/112–114, 150; 428/220, 428/516, 523, 212, 621, 626
See application file for complete search history.

(56) References Cited

U.S. PATENT DOCUMENTS

| | | | |
|---|---|---|---|
| 6,451,479 B1 * | 9/2002 | Kim | 429/163 |
| 6,455,192 B1 * | 9/2002 | Chang et al. | 429/176 |
| 6,946,216 B2 * | 9/2005 | Mu-Tsai et al. | 429/62 |
| 7,041,380 B2 * | 5/2006 | Yamashita et al. | 428/516 |
| 7,285,443 B2 * | 10/2007 | Fox et al. | 438/108 |
| 7,965,514 B2 * | 6/2011 | Hill et al. | 361/707 |
| 7,969,739 B2 * | 6/2011 | Tsunoda et al. | 361/704 |
| 2003/0180609 A1 * | 9/2003 | Yamashita et al. | 429/185 |
| 2004/0029001 A1 * | 2/2004 | Yamazaki et al. | 429/176 |
| 2005/0112461 A1 * | 5/2005 | Amine et al. | 429/185 |
| 2008/0310111 A1 * | 12/2008 | Hu | 361/700 |
| 2010/0072952 A1 * | 3/2010 | Nakajima | 320/150 |
| 2010/0309631 A1 * | 12/2010 | Hill et al. | 361/705 |
| 2010/0330408 A1 * | 12/2010 | Yoon et al. | 429/120 |
| 2011/0242764 A1 * | 10/2011 | Hill et al. | 361/705 |

FOREIGN PATENT DOCUMENTS

| | | | |
|---|---|---|---|
| JP | 4-9163197 A | * | 6/1997 |
| JP | 02000340186 A | * | 12/2000 |
| JP | 02007179775 A | * | 7/2007 |
| JP | 02008198860 A | * | 8/2008 |
| WO | WO2010001981 A1 | * | 1/2010 |

* cited by examiner

*Primary Examiner* — Michail V Datskovskiy
(74) *Attorney, Agent, or Firm* — Park, Vaughan, Fleming & Dowler, LLP; Chia-Hsin Suen

(57) ABSTRACT

The disclosed embodiments relate to techniques for facilitating thermal transfer in a portable electronic device. This portable electronic device may include a battery pack, which includes a battery cell and enclosure material for enclosing the battery cell. This enclosure material extends beyond the enclosure for the battery cell to facilitate thermal transfer within the portable electronic device.

23 Claims, 5 Drawing Sheets

USING A BATTERY PACK TO FACILITATE THERMAL TRANSFER IN A PORTABLE ELECTRONIC DEVICE

BACKGROUND

1. Field

The present embodiments relate to techniques for facilitating heat transfer in portable electronic devices. More specifically, the present embodiments relate to a technique that uses a battery pack to facilitate thermal transfer in a portable electronic device.

2. Related Art

A modern portable electronic device typically contains a set of tightly packed components. For example, a mobile phone may include a microphone, display, speakers, camera, buttons, battery, processor, memory, internal storage, and/or ports in a package that is less than 0.5 inches thick, 4-5 inches long, and 2-3 inches wide. Moreover, most components in the portable electronic device generate heat, which must be dissipated to enable safe use of the portable electronic device and improve long-term reliability. For example, heat generated by components in a mobile phone may be spread across the enclosure of the mobile phone to prevent damage to the components and increase user comfort and safety while operating the mobile phone.

However, heat-dissipation mechanisms for portable electronic devices generally involve the use of additional parts and/or materials. For example, heat sinks, cooling fans, heat pipes, thermal spreaders, and/or vents may be used to dissipate heat from components in a laptop computer. Such heat-dissipating parts and/or materials may take up space within the portable electronic devices and may add to the cost of the portable electronic devices.

Hence, space-efficient designs for portable electronic devices may be facilitated by mechanisms that reduce the dependence of the portable electronic devices on conventional heat-dissipating parts and/or materials.

SUMMARY

The disclosed embodiments relate to techniques for facilitating thermal transfer in a portable electronic device. This portable electronic device may include a battery pack, which includes a battery cell and enclosure material for enclosing the battery cell. This enclosure material extends beyond the enclosure for the battery cell to facilitate thermal transfer within the portable electronic device.

In some embodiments, the enclosure material forms a pouch which surrounds the battery cell and extends beyond a seal for the pouch.

In some embodiments, facilitating thermal transfer within the portable electronic device involves using the enclosure material to dissipate heat from a component in the portable electronic device and/or using the enclosure material to dissipate heat from the battery cell.

In some embodiments, the enclosure material dissipates heat from the component by covering the component.

In some embodiments, heat is further dissipated from the component by thermally bonding the enclosure material to the component using a thermal interface material (TIM) and/or an adhesive.

In some embodiments, the component is at least one of a processor, a power supply unit (PSU), a backlight, a charging circuit, a printed circuit board (PCB), a hard disk drive (HDD), and a radio transceiver.

In some embodiments, the enclosure material includes an internal layer, a conducting layer, and an external layer.

In some embodiments, the internal layer is a heat-sealable polymer, the external layer is nylon, and the conducting layer is copper, silver, or graphite.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
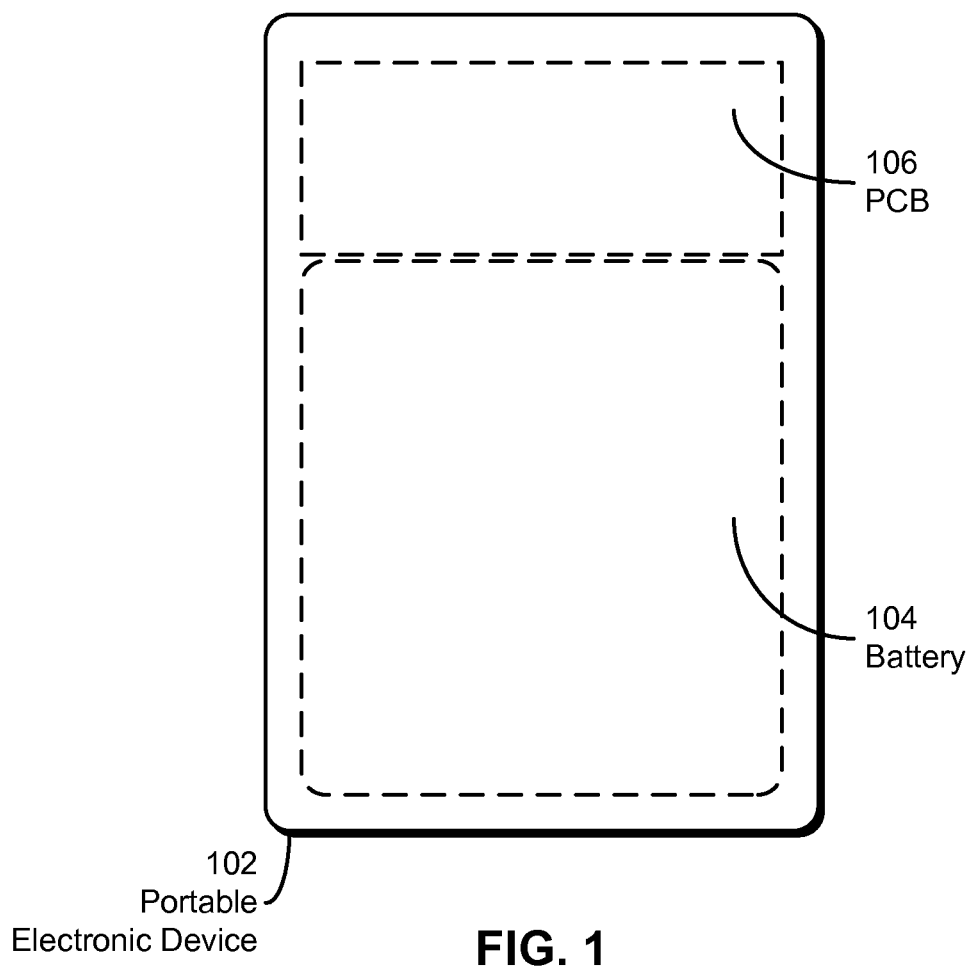
FIG. 1 shows the arrangement of components within a portable electronic device in accordance with an embodiment.

FIG. 1 shows the arrangement of components within a portable electronic device 102 in accordance with an embodiment. Portable electronic device 102 may correspond to a laptop computer, tablet computer, personal digital assistant (PDA), portable media player, mobile phone, digital camera, and/or other type of battery-powered electronic device. As shown in FIG. 1, a battery 104 and a printed circuit board (PCB) 106 are arranged within portable electronic device 102. Battery 104 may be placed side-by-side with PCB 106 within the enclosure for portable electronic device 102. In addition, the relatively large size of battery 104 may cause battery 104 to occupy a significant portion of space within portable electronic device 102.

Battery 104 may correspond to a lithium-polymer battery, lithium-ion battery, and/or other type of power source for portable electronic device 102. For example, battery 104 may correspond to a lithium-polymer battery that includes one or more cells packaged in flexible pouches. The cells may then be connected in series and/or in parallel and used to power portable electronic device 102.

PCB 106 may contain electronic components that are used to operate portable electronic device 102. For example, PCB 106 may be used to electrically connect a processor, memory, hard disk drive (HDD), input/output (I/O) components, and/or ports on a portable media player. The electronic components may be powered by battery 104 and/or by an external power source (e.g., power adapter) during operation.

Those skilled in the art will appreciate that the operation of portable electronic device 102 may generate heat, with increased use of components (e.g., on PCB 106) resulting in an increase in the temperature(s) of the components. For example, processor-intensive operations on a laptop computer may cause the central processing unit (CPU) of the computer to heat up. Such localized heat buildup may cause discomfort and/or injury to a user, and may further cause the components to lose reliability, behave unpredictably, and/or fail prematurely.

As a result, portable electronic device 102 may include mechanisms for dissipating heat from the components. For example, a layer of thermal spreader material may be positioned above both battery 104 and PCB 106 to allow heat generated by components on PCB 106 to spread to battery 104, the enclosure of portable electronic device 102, and/or other areas of portable electronic device 102. In other words, the thermal spreader material may facilitate thermal transfer within portable electronic device 102.

However, heat-dissipation materials may take up space within portable electronic device 102 and may increase the material and assembly costs for portable electronic device 102. For example, a 1-mm layer of thermal spreader material may occupy 20% of the thickness of a 5-mm-thick portable media player. The thermal spreader material may additionally be factored into the cost of parts for portable electronic device 102 and/or the cost of assembling portable electronic device 102.

In one or more embodiments, thermal transfer in portable electronic device 102 is facilitated without additional thermal spreader materials and/or other heat-dissipation materials. In particular, the enclosure material for battery 104 may be extended beyond the enclosure of battery 104. This enclosure material may include a layer of conducting material (e.g., copper, silver, graphite, etc.) that facilitates heat dissipation from heat-generating components (e.g., processor, power supply unit (PSU), backlight, charging circuit, PCB 106, HDD, radio transceiver) in portable electronic device 102. The composition of the enclosure material is discussed in further detail below with respect to FIG. 3.

To transfer heat away from the heat-generating components, the enclosure material may cover the heat-generating components. For example, the enclosure material may cover PCB 106 to transfer heat from a processor on PCB 106 to a large, relatively cool area (e.g., battery 104). Alternatively, the enclosure material may dissipate heat from battery 104 if battery 104 heats up during charging. As discussed in further detail below with respect to FIG. 2, the use of battery enclosure material to transfer heat may reduce the size of portable electronic device 102, increase user comfort in operating portable electronic device 102, protect components in portable electronic device 102, and/or reduce costs associated with the manufacture and assembly of portable electronic device 102.

Figure 2:
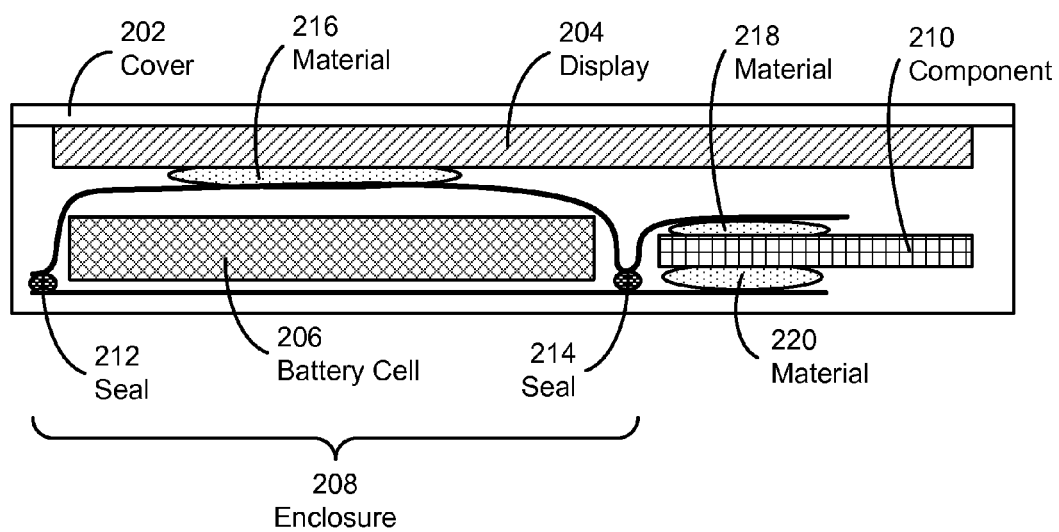
FIG. 2 shows a cross-sectional view of a portable electronic device in accordance with an embodiment.

FIG. 2 shows a cross-sectional view of a portable electronic device (e.g., portable electronic device 102 of FIG. 1) in accordance with an embodiment. As shown in FIG. 2, the portable electronic device includes a battery pack and a component 210. The battery pack includes a battery cell 206 and an enclosure 208 for battery cell 206. Walls for the enclosure may be formed from two seals 212-214. For example, battery cell 206 may correspond to a lithium-polymer battery cell that is sealed within a flexible pouch. To seal battery cell 206 in the pouch, battery cell 206 may be placed into the pouch, and heat and/or pressure may be applied at seals 212-214. On the other hand, battery cell 206 may correspond to a lithium-ion battery cell with a solid (e.g., metal) enclosure 208.

Regardless of the type of battery cell used, enclosure material for enclosing battery cell 206 may extend beyond enclosure 208 to facilitate thermal transfer in the portable electronic device. In particular, the enclosure material may spread heat from a heat-generating component 210 to a large, relatively cool area, such as battery cell 206, a display 204 for the portable electronic device, and/or a cover 202 for display 204. For example, the enclosure material may dissipate heat from a processor, a PSU, a backlight for display 204, a charging circuit for the battery, a PCB, an HDD, and/or a radio transceiver in the portable electronic device. Conversely, the enclosure material may dissipate heat from battery cell 206 through display 204, cover 202, component 210, and/or other parts of the portable electronic device if battery cell 206 generates heat while charging.

To dissipate heat from component 210, the enclosure material may cover component 210, as is shown in FIG. 2. Heat dissipation may further be facilitated by thermally bonding the enclosure material to component 210 and/or other parts of the portable electronic device (e.g., display 204) using a thermally conductive material 216-220 (e.g., thermal interface material (TIM), adhesive, etc.). For example, material 216 may thermally bond the top of enclosure 208 to display 204, material 218 may thermally bond the top of component 210 to the extension of the enclosure material, and material 220 may thermally bond the bottom of component 210 to the extension of the enclosure material.

The thermally conductive and/or adhesive properties of material 218-220 may additionally facilitate thermal transfer to or from uneven surfaces. For example, a thermal gel applied between components on a PCB and the extension of the enclosure material may allow the extension of the enclosure material to thermally contact components of different shapes and/or heights on the PCB.

Because additional thermal spreader materials and/or other heat-dissipation mechanisms are not used in the portable electronic device, the portable electronic device may decrease in size and/or complexity. In turn, the portability and/or physical attractiveness of the portable electronic device may increase, while costs associated with manufacturing and/or assembling the portable electronic device may decrease. For example, the lack of a thermal spreader layer between enclosure 208 and display 204 may reduce the thickness of the portable electronic device by ½ to 1 mm and eliminate one or more items from the bill of materials (BOM) for the portable electronic device. Moreover, the use of enclosure material to transfer heat to and from the battery may increase the thermal transfer efficiency of the portable electronic device, resulting in increased reliability, user comfort, and safety during use of the portable electronic device.

Figure 3:
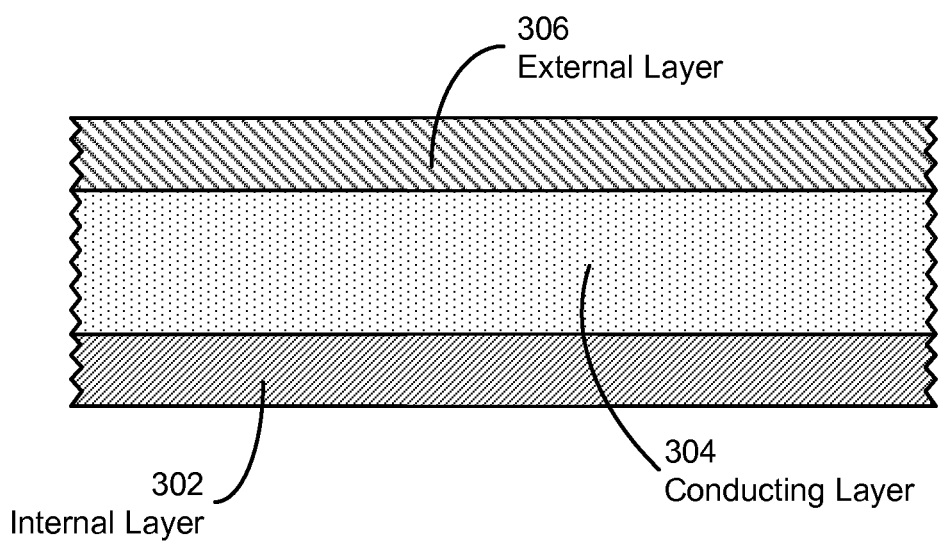
FIG. 3 shows a cross-sectional view of enclosure material for enclosing a battery cell in accordance with an embodiment.

FIG. 3 shows a cross-sectional view of enclosure material for enclosing a battery cell in accordance with an embodiment. The enclosure material includes an internal layer 302, a conducting layer 304, and an external layer 306. Internal layer 302 may correspond to the innermost layer of the battery cell's enclosure (e.g., the interior of the enclosure), external layer 306 may correspond to the outermost layer of the battery cell's enclosure (e.g., the exterior of a battery pack), and conducting layer 304 may be sandwiched between internal layer 302 and external layer 306.

In one or more embodiments, internal layer 302 is made from a heat-sealable polymer such as propylene chloride, polypropylene, and/or polyethylene. External layer 306 may be made from a protective polymer film such as nylon. Conducting layer 304 may be made from a thermally conductive material such as copper, silver, and/or graphite. Furthermore, conducting layer 304 may be thicker than internal layer 302 and/or external layer 306 to facilitate thermal transfer through the enclosure material. For example, internal layer 302 and external layer 306 may each be 10 microns thick, while conducting layer 304 may be 80 microns thick.

Figure 4:
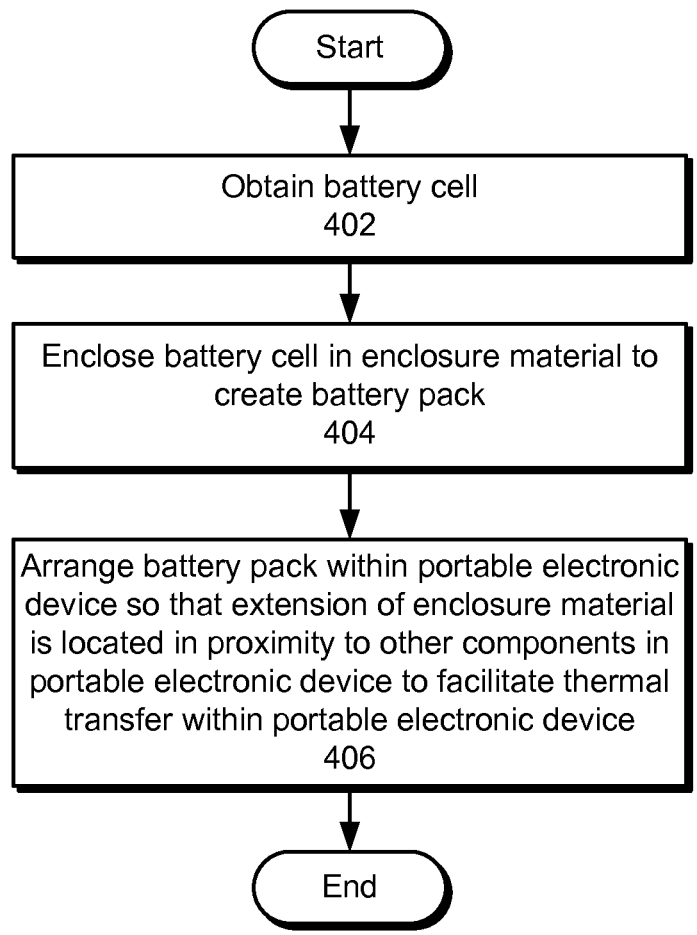
FIG. 4 shows a flowchart illustrating the process of facilitating use of a portable electronic device in accordance with an embodiment.

FIG. 4 shows a flowchart illustrating the process of facilitating use of a portable electronic device in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

First, a battery cell is obtained (operation 402). The battery cell may correspond to a lithium-ion battery cell and/or a lithium-polymer battery cell. Next, the battery cell is enclosed in enclosure material to create a battery pack (operation 404). For example, a lithium-polymer battery cell may be placed in a flexible pouch with a polymer or gel electrolyte. Heat may then be applied along one or more seals in the pouch to enclose the battery cell in the pouch.

Moreover, the battery cell may be enclosed such that the enclosure material extends beyond the enclosure for the battery cell. The extension of the enclosure material may facilitate thermal transfer within a portable electronic device containing the battery pack. In particular, the battery pack may be arranged within the portable electronic device so that the extension of the enclosure material is located in proximity to other components in the portable electronic device (operation 406). For example, the extension of the enclosure material may dissipate heat from the other components to the battery cell by covering the other components, or the extension of the enclosure material may facilitate heat transfer away from the battery cell. To further dissipate heat from the other components, the extension of the enclosure material may be thermally bonded to the other components using a TIM and/or adhesive.

Figure 5:
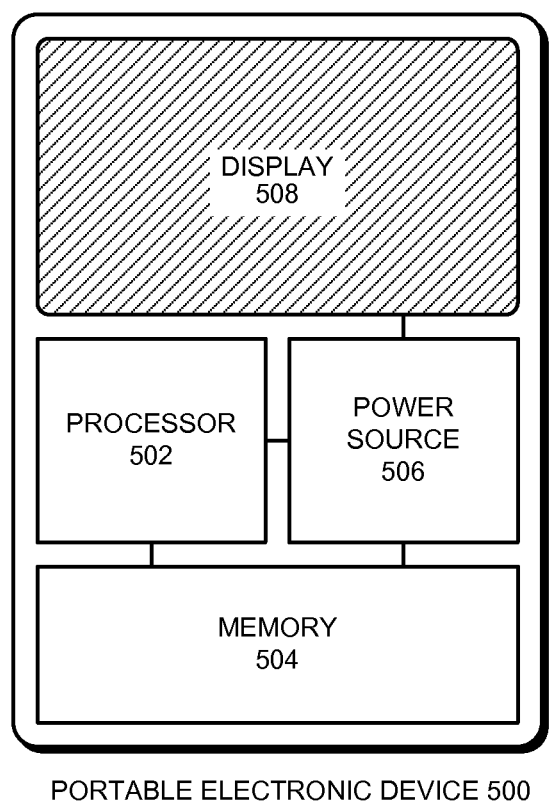
FIG. 5 shows a portable electronic device in accordance with an embodiment.

The above-described rechargeable battery cell can generally be used in any type of electronic device. For example, FIG. 5 illustrates a portable electronic device 500 which includes a processor 502, a memory 504 and a display 508, which are all powered by a battery 506. Portable electronic device 500 may correspond to a laptop computer, tablet computer, mobile phone, PDA, portable media player, digital camera, and/or other type of battery-powered electronic device. Battery 506 may correspond to a battery pack that includes one or more battery cells. The battery pack may also include enclosure material that encloses the battery cell. The enclosure material may extend beyond the enclosure for the battery cell to facilitate thermal transfer within portable electronic device 500. For example, the enclosure material may dissipate heat from a component in the portable electronic device and/or from the battery cell.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A battery pack, comprising:
    a battery cell; and
    an enclosure material that forms a pouch which is sealed to enclose the battery cell and an associated electrolyte;
    wherein the enclosure material extends beyond a seal for the pouch to facilitate thermal transfer within a portable electronic device containing the battery cell.

2. The battery pack of claim 1, wherein facilitating thermal transfer within the portable electronic device involves at least one of:
    using the enclosure material to dissipate heat from a component in the portable electronic device; and
    using the enclosure material to dissipate heat from the battery cell.

3. The battery pack of claim 2, wherein the enclosure material dissipates heat from the component by covering the component.

4. The battery pack of claim 3, wherein heat is further dissipated from the component by thermally bonding the enclosure material to the component using at least one of a thermal interface material (TIM) and an adhesive.

5. The battery pack of claim 2, wherein the component is at least one of a processor, a power supply unit (PSU), a backlight, a charging circuit, a printed circuit board (PCB), a hard disk drive (HDD), and a radio transceiver.

6. The battery pack of claim 1, wherein the enclosure material comprises:
    an internal layer;
    a conducting layer; and
    an external layer.

7. The battery pack of claim 6,
    wherein the internal layer is a heat-sealable polymer and the external layer is nylon, and
    wherein the conducting layer is copper, silver, or graphite.

8. A method for facilitating use of a portable electronic device, comprising:
    obtaining a battery cell;
    enclosing and sealing the battery cell an associated electrolyte in a pouch formed by enclosure material to create a battery pack, wherein the enclosure material extends beyond a seal for the pouch; and
    arranging the battery pack within the portable electronic device so that the extension of the enclosure material is located in proximity to other components in the portable electronic device to facilitate thermal transfer within the portable electronic device.

9. The method of claim 8, wherein facilitating thermal transfer within the portable electronic device involves at least one of:

using the enclosure material to dissipate heat from a component in the portable electronic device; and using the enclosure material to dissipate heat from the battery cell.

10. The method of claim 9, wherein the enclosure material dissipates heat from the component by covering the component.

11. The method of claim 10, wherein heat is further dissipated from the component by thermally bonding the enclosure material to the component using at least one of a thermal interface material (TIM) and an adhesive.

12. The method of claim 9, wherein the component is at least one of a processor, a power supply unit (PSU), a backlight, a charging circuit, a printed circuit board (PCB), a hard disk drive (HDD), and a radio transceiver.

13. The method of claim 8, wherein the enclosure material comprises:
    an internal layer;
    a conducting layer; and
    an external layer.

14. The method of claim 13,
    wherein the internal layer is a heat-sealable polymer and the external layer is nylon, and
    wherein the conducting layer is copper, silver, or graphite.

15. The method of claim 8,
    wherein the enclosure material forms a pouch which surrounds the battery cell, and
    wherein the enclosure material extends beyond a seal for the pouch.

16. A portable electronic device, comprising:
    a set of components powered by a battery pack; and
    the battery pack, comprising:
        a battery cell; and
        an enclosure material that forms a pouch which is sealed to enclose the battery cell and an associated electrolyte,
        wherein the enclosure material extends beyond a seal for the pouch to facilitate thermal transfer within a portable electronic device containing the battery cell.

17. The portable electronic device of claim 16, wherein facilitating thermal transfer within the portable electronic device involves at least one of:
    using the enclosure material to dissipate heat from a component in the portable electronic device; and
    using the enclosure material to dissipate heat from the battery cell.

18. The portable electronic device of claim 17, wherein the enclosure material dissipates heat from the component by covering the component.

19. The portable electronic device of claim 18, wherein heat is further dissipated from the component by thermally bonding the enclosure material to the component using at least one of a thermal interface material (TIM) and an adhesive.

20. The portable electronic device of claim 17, wherein the component is at least one of a processor, a power supply unit (PSU), a backlight, a charging circuit, a printed circuit board (PCB), a hard disk drive (HDD), and a radio transceiver.

21. The portable electronic device of claim 16, wherein the enclosure material comprises:
    an internal layer;
    a conducting layer; and
    an external layer.

22. The portable electronic device of claim 21,
    wherein the internal layer is a heat-sealable polymer and the external layer is nylon, and
    wherein the conducting layer is copper, silver, or graphite.

23. The portable electronic device of claim 16, wherein the battery cell is at least one of a lithium-ion battery cell and a lithium-polymer battery cell.

* * * * *